(12) United States Patent
Fletcher

(10) Patent No.: US 10,990,004 B2
(45) Date of Patent: Apr. 27, 2021

(54) PHOTODISSOCIATION FRAME WINDOW, SYSTEMS INCLUDING A PHOTODISSOCIATION FRAME WINDOW, AND METHODS OF USING A PHOTODISSOCIATION FRAME WINDOW

(71) Applicant: CANON KABUSHIKI KAISHA, Tokyo (JP)

(72) Inventor: Edward Brian Fletcher, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 384 days.

(21) Appl. No.: 16/039,074

(22) Filed: Jul. 18, 2018

(65) Prior Publication Data
US 2020/0026183 A1    Jan. 23, 2020

(51) Int. Cl.
| | |
|---|---|
| B08B 7/00 | (2006.01) |
| G03F 7/00 | (2006.01) |
| B29C 59/02 | (2006.01) |
| B29C 35/08 | (2006.01) |
| B82Y 40/00 | (2011.01) |

(52) U.S. Cl.
CPC ........ G03F 7/0002 (2013.01); B29C 35/0805 (2013.01); B29C 59/022 (2013.01); B29C 2035/0827 (2013.01); B29C 2035/0833 (2013.01); B82Y 40/00 (2013.01)

(58) Field of Classification Search
None
See application file for complete search history.

(56) References Cited

U.S. PATENT DOCUMENTS

| | | | |
|---|---|---|---|
| 6,627,846 B1 * | 9/2003 | Yogev | B08B 7/0035 219/121.6 |
| 6,936,194 B2 | 8/2005 | Watts | |
| 7,157,036 B2 | 1/2007 | Choi et al. | |
| 7,473,090 B2 | 1/2009 | McMackin et al. | |
| 7,846,266 B1 | 12/2010 | Dibiase | |
| 8,012,395 B2 | 9/2011 | Selinidis et al. | |
| 8,066,930 B2 | 11/2011 | Sreenivasan et al. | |
| 8,076,386 B2 | 12/2011 | Xu et al. | |
| 8,202,463 B2 | 6/2012 | Yoneda et al. | |
| 8,268,220 B2 | 9/2012 | Xu et al. | |
| 8,349,241 B2 | 1/2013 | Sreenivasan et al. | |
| 8,394,203 B2 | 3/2013 | Schmid et al. | |
| 8,522,802 B2 | 9/2013 | Nakashima et al. | |
| 8,641,941 B2 | 2/2014 | Fletcher et al. | |
| 9,050,633 B2 | 6/2015 | Horibe | |
| 9,063,409 B2 | 6/2015 | Khusnatdinov et al. | |
| 9,108,343 B2 | 8/2015 | Ota | |
| 9,164,377 B2 | 10/2015 | Tomita et al. | |
| 9,475,213 B2 | 10/2016 | Kobayashi et al. | |

(Continued)

OTHER PUBLICATIONS

Mehul N. Patel, Edward Brian Fletcher, Seth J. Bamesberger, Alireza Aghili, U.S. Appl. No. 16/106,147; Fast and Accurate Alignment Control in Imprint Lithography Based on Sinusoidal Decomposition, filed on Aug. 21, 2018.

*Primary Examiner* — Cachet I Proctor
(74) *Attorney, Agent, or Firm* — Daniel Ratoff

(57) ABSTRACT

An apparatus, method, and frame window configured to clean mesa sidewalls of a template with photodissociation radiation. Material on the mesa sidewalls are removed from the mesa sidewalls by exposing the portion of a first gap adjacent to the mesa sidewalls to the photodissociation radiation.

5 Claims, 11 Drawing Sheets

(56) References Cited

U.S. PATENT DOCUMENTS

| | | |
|---|---|---|
| 2008/1020327 | 8/2008 | Okinaka et al. |
| 2008/0303187 A1* | 12/2008 | Stacey .................. B82Y 10/00 264/293 |
| 2009/0038636 A1 | 2/2009 | Wuister et al. |
| 2010/0084376 A1* | 4/2010 | Khusnatdinov ......... B32B 37/14 216/39 |
| 2010/0109205 A1* | 5/2010 | Fletcher ................ G03F 7/0002 264/447 |
| 2011/0140304 A1 | 6/2011 | Choi et al. |
| 2012/0201969 A1 | 8/2012 | Fletcher et al. |
| 2013/0200553 A1 | 8/2013 | Yamada et al. |
| 2013/0224322 A1 | 8/2013 | Shizawa et al. |
| 2014/0083454 A1 | 3/2014 | Wakamatsu et al. |
| 2015/0136173 A1 | 5/2015 | Yamada et al. |
| 2015/0165650 A1 | 6/2015 | Miyajima et al. |
| 2016/0001492 A1 | 1/2016 | Yamaguchi et al. |
| 2018/0016673 A1 | 1/2018 | Nakamura et al. |
| 2019/0377257 A1* | 12/2019 | Fletcher ................ G03F 7/0002 |

* cited by examiner

PHOTODISSOCIATION FRAME WINDOW, SYSTEMS INCLUDING A PHOTODISSOCIATION FRAME WINDOW, AND METHODS OF USING A PHOTODISSOCIATION FRAME WINDOW

BACKGROUND

Field of Art

The present disclosure relates to a photodissociation frame window systems and methods of using photodissociation frame window for cleaning mesa sidewalls of a template while protecting a patterning surface of the template from modification.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

Prior to imprinting a patterning surface of the template may be pretreated with one or more materials using one or more pre-treatment processes. For example, the patterning surface may be dipped in a solution that creates hydrophilic bonds on the patterning surface as described in U.S. Pat. No. 8,076,386. The patterning surface may also be sprayed with a surfactant. The patterning surface is on a mesa of the template. The mesa is surrounded by a recessed surface. Sidewalls connect the recessed surface to the mesa. During the imprinting process formable liquid sometimes extrudes out from the imprint field attaches to the sidewalls forming extrusions. These extrusions can cause damage in latter imprinting steps.

SUMMARY

At least a first embodiment, may be an apparatus configured to clean mesa sidewalls of a template. The template has a pattern area on a first surface of a mesa. The mesa sidewalls surround the mesa. A recessed surface surrounds the mesa sidewalls. The apparatus may comprise: a template chuck configured to hold the template; a photodissociation light source configured to emit photodissociation radiation; a photodissociation frame window; and a positioning system that may be configured to form a first gap between the photodissociation frame window and the template. The photodissociation frame window may comprise: a central region; and a window region surrounding the central region. Transmittance of photodissociation radiation by the central region may be less than a damage threshold. Transmittance of photodissociation radiation by the window region may be greater than a reaction threshold. The first gap may be bounded by: the mesa sidewalls; the recessed surface; and the window region of the photodissociation frame window. The photodissociation light source may be positioned to send photodissociation radiation through the window region so as to expose a portion of the first gap adjacent to the mesa sidewalls to the photodissociation radiation. Material on the mesa sidewalls may be removed from the mesa sidewalls by exposing the portion of the first gap adjacent to the mesa sidewalls to the photodissociation radiation.

In an aspect of the first embodiment, the central region may have a raised area relative to the window region. The positioning system may be further configured to position the template relative to the photodissociation frame window such that: a second gap between the central region and the pattern area of the mesa is formed.

In an aspect of the first embodiment, a first gas source may be configured to supply a precursor gas to the first gap via a first set of one or more gas ports, wherein the one or more gas ports are located in one or more of: a frame region that surrounds the window region; the template; and nozzles adjacent to the first gap. The precursor gas may become a reactive gas when exposed to the photodissociation radiation. The reactive gas may remove material on the mesa sidewalls.

In an aspect of the first embodiment, the positioning system may be further configured to form a second gap between the central region of the photodissociation frame window and the pattern area of the template. The second gap may be narrow enough to provide resistance to the reactive gas in the first gap. The photodissociation light source may shine photodissociation radiation through the window region only after the second gap is narrow enough to provide the resistance to the reactive gas in the first gap.

In an aspect of the first embodiment, a second gas source may be configured to supply a protective gas to the second gap via a second set of one or more gas ports located on the central region of the of the photodissociation frame window.

In an aspect of the first embodiment, the reactive gas may be prevented from reaching a pattern area coating on a pattern area of the template while removing material from the mesa sidewalls.

In an aspect of the first embodiment, the photodissociation radiation may have a wavelength intensity peak at 172 nm.

In an aspect of the first embodiment, may further comprise exhaust ports for pulling gas from the first gap.

In an aspect of the first embodiment, the photodissociation frame window may further comprise a frame region surrounding the window region. The transmittance of the photodissociation radiation by the frame region may be less than the damage threshold. The first gap may also bounded by the frame region.

At least a second embodiment, may be a method for cleaning mesa sidewalls of a template. The template may have a pattern area on a first surface of a mesa. The mesa sidewalls surround the mesa. A recessed surface surrounds the mesa sidewalls. The method may comprise: holding the template; forming a first gap between a photodissociation frame window and the template; and sending photodissociation radiation through the window region to expose a portion of the first gap adjacent to the mesa sidewalls to the photodissociation radiation. The photodissociation frame window may comprise: a central region; and a window region surrounding the central region. Transmittance of photodissociation radiation by the central region may be less than a damage threshold. Transmittance of photodissociation radiation by the window region may be greater than a reaction threshold. The first gap may be bounded by: the mesa sidewalls; the recessed surface; and the window region of the photodissociation frame window. Material on the mesa sidewalls may be removed from the mesa sidewalls by exposing the portion of the first gap adjacent to the mesa sidewalls to the photodissociation radiation.

In an aspect of the second embodiment, the positioning system may be further configured to position the template relative to the photodissociation frame window such that a second gap between the central region and the pattern area of the mesa is formed. A protective gas may be sent into the second gap.

In an aspect of the second embodiment, may further comprise sending photodissociation radiation through the window region to expose a precursor gas in the first gap only after the protective gas is supplied to the second gap.

In an aspect of the second embodiment, may further comprise stop sending photodissociation radiation through the window region. The method may further comprise after photodissociation radiation is no longer sent through the window region, removing gas in the first gap using one or both of: drawing gas from the first gap using vacuum; and supplying a purging gas to the first gap. The method may further comprise moving the template farther away from the photodissociation frame window, after the gas in the first gap has started being removed from the first gap.

In an aspect of the second embodiment, the photodissociation frame window may further comprises a frame region surrounding the window region. Transmittance of photodissociation radiation by the frame region may be less than a damage threshold. The first gap may also be bounded by the frame region.

A third embodiment is an imprinting method. The imprinting method may comprise cleaning the mesa sidewalls of the template according to a second embodiment. The imprinting method may further comprise imprinting formable material on a substrate using the template with the mesa sidewalls which have been cleaned. The imprinting method may also further comprise curing the formable material that has been imprinted forming a patterned layer on the substrate.

A fourth embodiment is an article manufacturing method. The article manufacturing method may comprise imprinting the substrate according to the third embodiment. The article manufacturing method may further comprise processing the patterned layer on the substrate so as to obtain one or more articles from the substrate.

At least a fifth embodiment, may be a photodissociation frame window, comprising: a central region; and a window region surrounding the central region. Transmittance of photodissociation radiation by the central region may be less than a damage threshold. Transmittance of photodissociation radiation by the window region may be greater than a reaction threshold.

In an aspect of the third embodiment, the central region may have a raised area relative to the window region.

In an aspect of the third embodiment, the photodissociation frame may further comprise a first set of one or more gas ports located in a frame region surrounding the window region. Each of the gas ports among the first set of one or more gas ports may be configured to be connected to a precursor gas source. The precursor gas may become a reactive gas when exposed to photodissociation radiation.

In an aspect of the third embodiment, the photodissociation frame window may further comprise a second set of one or more gas ports located in the central region. Each of the gas ports among the first set of one or more gas ports may be configured to be connected to a protective gas source.

In an aspect of the third embodiment, the photodissociation frame may further comprise channels in the central region. The channels are configured to guide gas from the second set of one or more gas ports to a border between the central region and the frame region.

In an aspect of the third embodiment, the photodissociation frame may further comprise a frame region surrounding the window region. Transmittance of photodissociation radiation by the frame region may be less than a damage threshold.

In an aspect of the third embodiment, the frame region may include a raised area.

In an aspect of the third embodiment, the central region and the frame region absorb at least 90% of the photodissociation radiation incident on the central region and the frame region.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
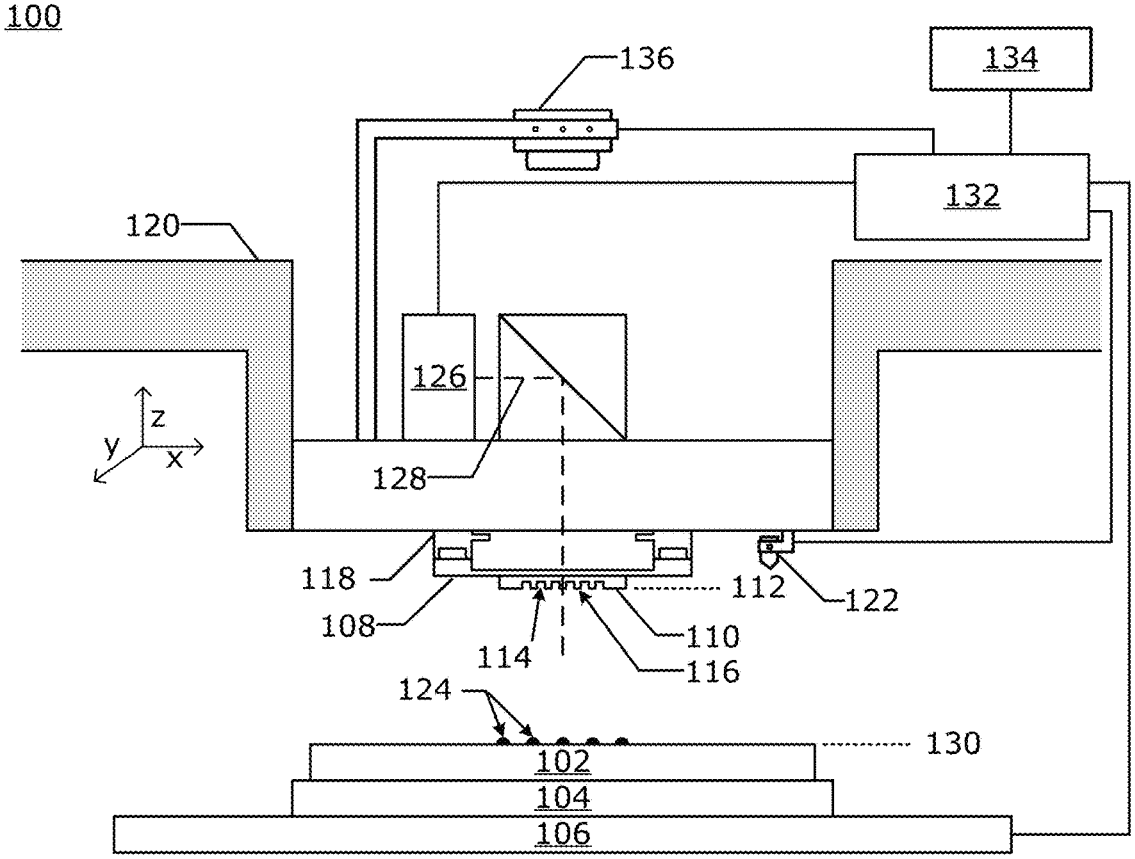
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a system and/or method that prevents extrusions from forming on the sidewalls or removing extrusions from sidewalls while protecting the pretreated patterning surface.

Nanoimprint System

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move template 108.

Nanoimprint lithography system 100 may further comprise a fluid dispenser 122. The fluid dispenser 122 may also be moveably coupled to the bridge. In an embodiment, the fluid dispenser 122 and the template chuck 120 share one or more positioning components. In an alternative embodiment, the fluid dispenser 122 and the template chuck 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 that directs actinic energy along an exposure path 128. The Imprint head and the substrate positioning stage 106 may be configured to position the template 108 and the substrate 102 in superimposition with the exposure path 128. A camera 136 may likewise be positioned such that an imaging field of the camera 128 is in superimposition with the exposure path 128.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the source 126, and/or the camera 136 and may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory includes but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head, the substrate positioning stage 106, or both varies a distance between the mold 110 and the substrate 102 to define a desired volume that is filled by the formable material 124. For example, the imprint head may apply a force to the template 108 such that mold 110 is in contact with the formable material 124. After the desired volume is filled with the formable material 124, the source 126 produces energy, e.g., actinic radiation (UV), causing formable material 124 to cure, solidify, and/or cross-link conforming to a shape of the substrate surface 130 and the patterning surface 112, defining a patterned layer on the substrate 102. The formable material 124 is cured while the template 108 is in contact with formable material 124 forming the patterned layer on the substrate 102. Thus the nanoimprint lithography system 100 uses an imprinting process to form the patterned layer which has recesses and protrusions which are an inverse of the pattern in the patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include fluid control features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) above a highest point on the substrate surface 130 in each imprint field. The patterned layer may also include one or more features such as protrusions which extend above the residual layer having a thickness. These protrusions match the recesses 114 in the mesa 110.

Template

Figure 2:
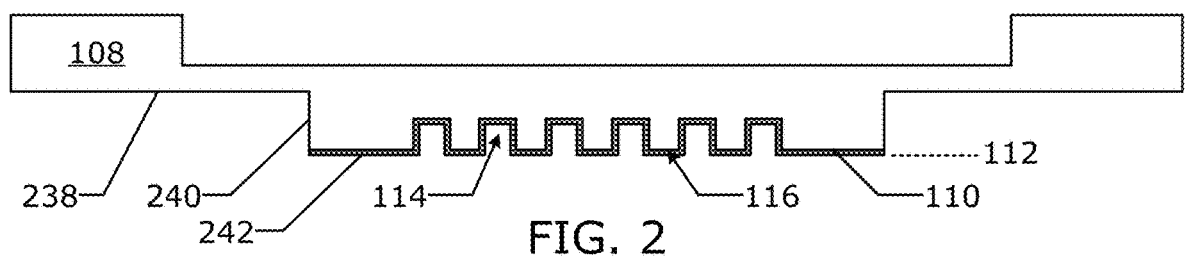
FIG. 2 is an illustration of a template with mesa sidewalls which is may be modified in an embodiment.

FIG. 2 is an illustration of a template 108 that may be used in an embodiment. The patterning surface 112 is on a mesa 110. The mesa 110 is surrounded by a recessed surface 238. Mesa sidewalls 240 connect the recessed surface 238 to a top surface of the mesa 110. The mesa sidewalls 240 surround the mesa 110. In an embodiment in which the mesa is round or has rounded corners, the mesa sidewalls refers to a single mesa sidewall that is a continuous wall without corners. The template 108 also includes a patterning surface coating 242 on the patterning surface 112. The patterning surface coating may be a monolayer of a release agent that is constantly replenished during the imprinting process as described in U.S. Pat. No. 8,268,220.

Extrusions

Figure 3:
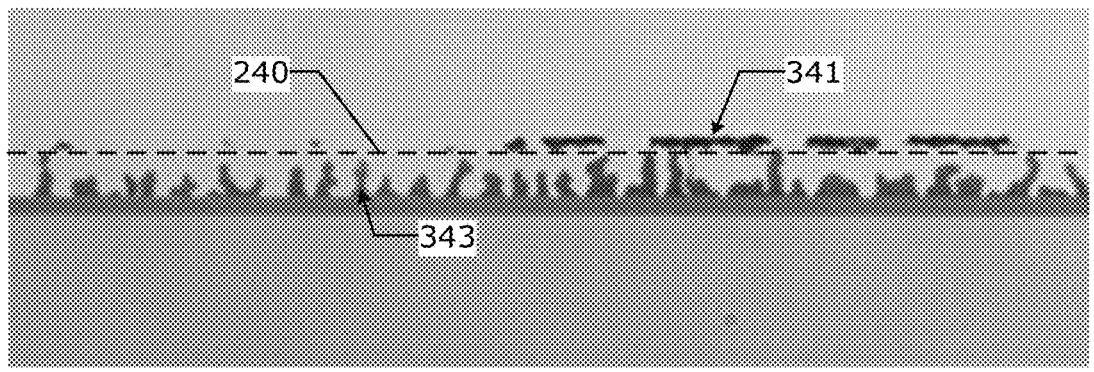
FIG. 3 is a micrograph illustrating extrusions that have detached from a mesa sidewall and adhered to a substrate.

During the imprinting process a single template 108 may be used to imprint a plurality of imprint fields over a plurality of substrates (wafers) in a step and repeat process. During the imprinting process, the formable material 124 can accumulate as an extrusion on the mesa sidewalls 240 via one or both seepage or vapor deposition. FIG. 3 is a micrograph of finger projections 343 of cured formable material that are partially filling a fluid control feature that borders the mesa sidewalls 240. The location of the mesa sidewall 240 is represented as a dashed line overlaid on top of the micrograph. The finger projections 343 are within the mesa. The finger projections do not typically extend beyond the mesa sidewall 240. When extrusions do extend beyond the mesa sidewall they form extrusions 341 which eventually fall off and form defects on the substrate as illustrated in FIG. 3.

Figure 4A:
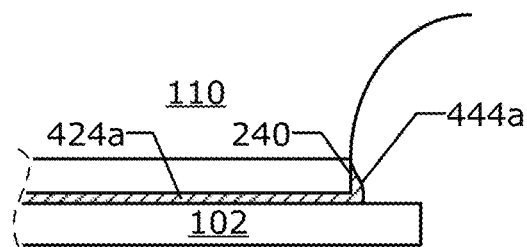
FIGS. 4A-4E are illustrations of how extrusions are formed and the damage they can cause.

FIG. 4A is an illustration of a mesa 110 in contact with the formable material 124 forming a liquid layer 424*a* in a first imprint field on the substrate 102. In FIG. 4A some of the formable material leaks out and forms a small liquid extrusion 444*a*.

Figure 4B:
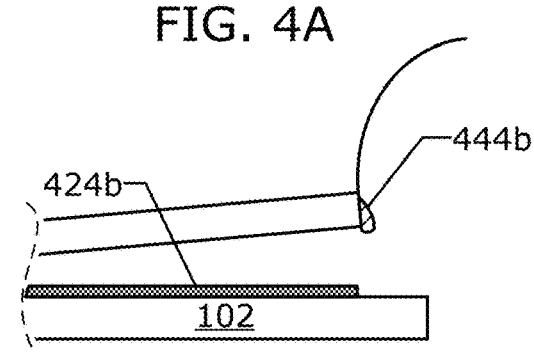

FIG. 4B is an illustration of the mesa 110 being pulled up from a solid layer 424*b*. The solid layer 424*b* may be a cured or partially cured layer. The shape of the solid layer 424*b* will conform to the shape of the patterning surface 112. Sometimes, an extrusion 444*a* becomes an attached extrusion 444*b* as illustrated in FIG. 4B. The attached extrusion 444*b* may be liquid, partially cured, or fully cured. The extrusion whether or not it fully attaches to the mesa sidewall or the substrate can leave some residue of the formable material on the mesa sidewall where it was in contact with the mesa sidewall.

Figure 4C:
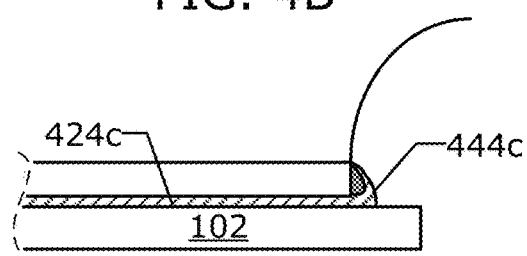
Figure 4D:
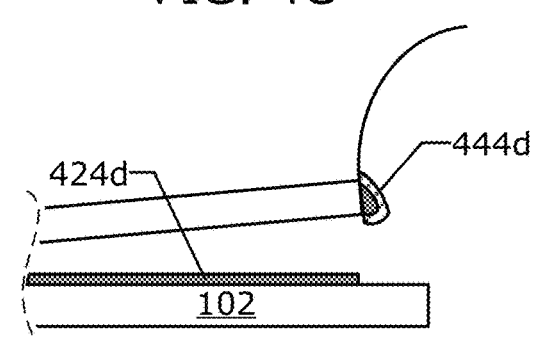
Figure 4E:
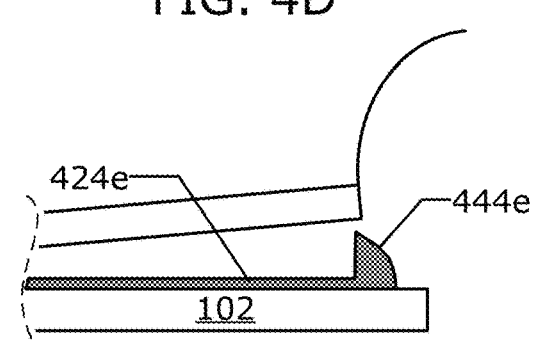

FIG. 4C is an illustration of the mesa 110 imprinting another liquid layer 424*c* in a subsequent imprint field. Once an extrusion or other residue has attached itself to the mesa sidewall 240 it acts as a seed for additional extrusions, additional material 444*c* starts to gather on the attached extrusion 444*b* causing it grow as illustrated in FIGS. 4C-D. The liquid layer 424*c* in the subsequent imprint field is exposed to actinic radiation which causes it to polymerize and form the solid layer 424*d*. The exposure to actinic radiation also causes the attached extrusions to polymerize and harden. This process repeats causing the extrusion to grow as illustrated in FIG. 4D. The growing extrusion continues to adhere to the mesa sidewall 240. Eventually the extrusion will become large enough and detach from the mesa sidewall 240 forming a defect 444*e* that becomes a part of solid layer 424*e* as illustrated in FIG. 4E. The defect 444*e* can potentially cause a defect in subsequent pattern transfer processes which can ultimately affect device yield.

Figure 5A:
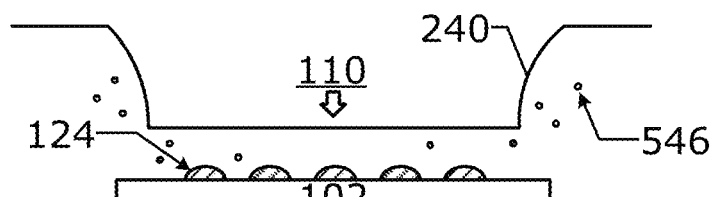
FIGS. 5A-5D are additional illustrations of how extrusions are formed and the damage they can cause.
Figure 5B:
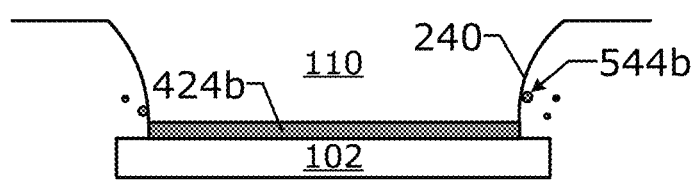
Figure 5C:
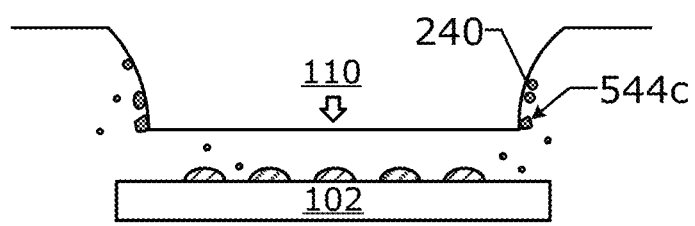
Figure 5D:
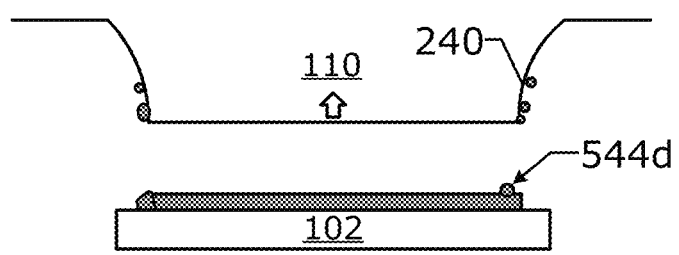

FIGS. 5A-5D are illustrations of a different mechanism by which extrusions are formed on the mesa sidewalls 240. FIG. 5A is an illustration of a mesa 110 with sidewalls 240 that is used to imprint formable material 124 in a first imprint field on the substrate 102. A nanoimprint lithography system 100 may use a formable material 124 that has a vapor pressure which produces vapor 546. FIG. 5B is an illustration of the template in contact with the liquid layer 424*b*, while the vapor 544*b* coats the mesa sidewall 240. During subsequent imprints the vapor continues to accumulate producing attached extrusions 544*c* as illustrated in FIG. 5C. Over time the accumulated extrusions can cure and adhere to the substrate 102 as a defect 544*d*. The extrusions may also fall onto the substrate 102 from the mesa sidewall 240.

These extrusions and defects can cause problems and create fatal defects in the current process and/or subsequent processes. The applicant has determined that if theses extrusions are removed from the mesa sidewalls 240 while leaving the patterning surface coating 242 intact then the performance and throughput of the imprinting process can be improved.

Mesa Sidewall Cleaning Apparatus

The applicant has found that it is advantageous to remove these extrusions from the mesa sidewalls 240. Previous efforts to remove extrusions from the mesa sidewalls 240 would sometimes or always damage the patterning surface coating 242.

Figure 6A:
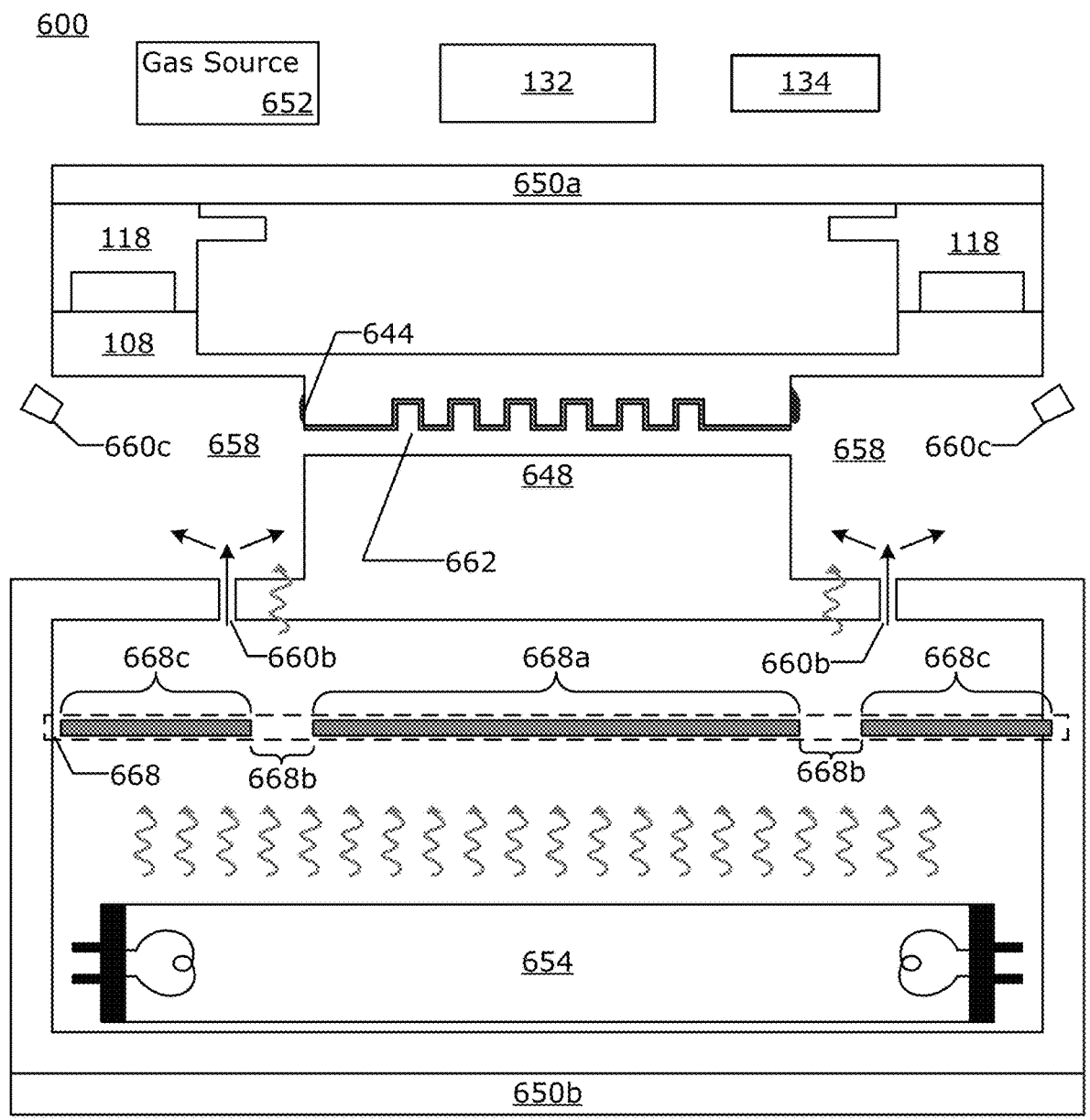
FIGS. 6A-6J are illustrations of embodiments which are used to clean mesa sidewalls in embodiments.

FIG. 6A is an illustration of a mesa sidewall cleaning apparatus 600 that includes a photodissociating frame window 648, a positioning system 650, a processor 132, a memory 134, and may include an optional gas source 652. The photodissociating frame window 648 may include or be connected to a photodissociating radiation source 654. The photodissociating frame window 648 includes a spatial filter 668. The spatial filter 668 has: a central region 668a; a window region 668b surrounding the central region 668a; and a frame region 668c surrounding the window region 668b.

The spatial filter 668 is configured to allow photodissociating radiation from the photodissociating radiation source 654 to reach the mesa sidewalls 240 and/or the region adjacent to the mesa sidewalls 240 when the template 108 and the photodissociating frame window 648 are in a cleaning position. The spatial filter 668 also prevents photodissociating radiation from the photodissociating radiation source 654 from reaching the patterning area on the patterning surface 112 of the template 108 when, the template 108 and the photodissociating frame window 648 are in a cleaning position. The gas source 652 may be connected to gas ports which guide a precursor gas, a purging gas, or a protective gas to area between the template 108 and the photodissociating frame window 648. After the precursor gas is exposed to photodissociating radiation it becomes a reactive gas. The reactive gas and photodissociation radiation remove and clean formable material residue from the mesa sidewall by breaking down formable material into volatile species through oxidation and photolysis.

As illustrated in FIG. 6A the template 108 loaded into the mesa sidewall cleaning apparatus 600 may have a patterning surface coating 242 and may have extrusions 644 which have formed on the mesa sidewalls 240. In an embodiment, the mesa sidewall cleaning apparatus 600 is used to remove these extrusions 644 while the patterning surface coating 242 is protected.

Cleaning the mesa sidewalls with this apparatus, which may be integrated into the nanoimprint lithography system 100, improves productivity of the nanoimprint lithography system 100, by preventing or prolonging the onset of extrusions that require the template 108 to be removed from the nanoimprint lithography system 100. Replacing a template 108 in the nanoimprint lithography system 100 may include unloading the template, loading, registering, leveling, and priming the new template 108. Priming the new template may include preparing the template's surface chemistry.

In an embodiment, the mesa sidewalls 240 may be cleaned on a periodic basis in a manner which does not affect the patterning surface coating 242. If the active-area surface chemistry can be maintained so that the template does not require priming again, then this increases the productivity of the nanoimprint lithography system 100.

In an embodiment, the nanoimprint lithography system 100 is the cleaning system and during the course of device substrate processing, after some number of device substrates are processed, the photodissociating frame window 648 is loaded onto a chuck. The photodissociating radiation source 654 and/or the gas source may also be incorporated into the nanoimprint lithography system 100.

In an embodiment, as the photodissociating frame window 648 and the template 108 are heated by the mesa sidewall cleaning process. The photodissociating frame window 648 and the template 108 may be actively cooled. Liquid, air, and/or thermoelectric cooling may be used to extract heat from the template 108.

In an alternative embodiment, the photodissociating frame window 648 is attached to the substrate chuck 104 of the nanoimprint lithography system 100 during the mesa sidewall cleaning process. In an alternative embodiment, the photodissociating frame window 648 is attached to a photodissociating frame window chuck 650b in the nanoimprint lithography system 100 or connected to the nanoimprint lithography system 100. In an embodiment, the photodissociating frame window 648 is part of a mesa sidewall cleaning apparatus that is separate from the nanoimprint lithography system 100. In an alternative embodiment, the mesa sidewall cleaning apparatus may share one or more components of the nanoimprint lithography system 100. Examples of components that may be shared are but are not limited to: the template chuck; one or more positioning stages; substrate chucks; gas supply components; etc.

The Photodissociating Frame Window

Figure 6B:
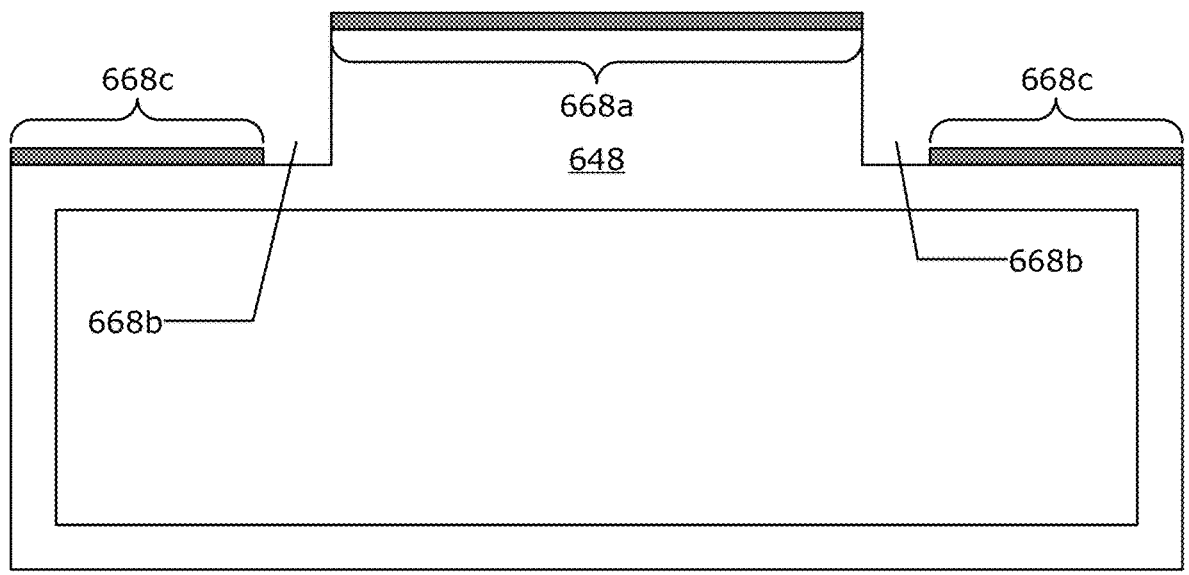

The photodissociating frame window 648 may include one or more features that allow the photodissociating frame window 648 to protect the patterning surface coating 242. The photodissociating frame window 648 may be fabricated and coated with materials that are non-reactive to the mesa sidewall cleaning conditions. The photodissociating frame window 648 includes the spatial filter 668. In an embodiment, the spatial filter 668 may be located above a photodissociating window relative to the template 108 as illustrated in FIG. 6B. The photodissociating window and/or the window region 668b is/are substantially transparent to photodissociating radiation. The photodissociating window and/or the window region 668b may be made of: Magnesium Fluoride ($MgF_2$); Calcium Fluoride ($CaF_2$); Sapphire ($Al_2O_3$); Barium Fluoride ($BaF_2$); Quartz ($SiO_2$); and/or fused silica ($SiO_2$). The photodissociating window may be incorporated into the photodissociating frame window 648 as illustrated in FIG. 6B. The photodissociating window may protect the spatial filter 648 from the mesa sidewall cleaning conditions. In an alternative embodiment, the spatial filter 648 is located above the photodissociating window relative to the template 108 as illustrated in FIG. 6A. In an alternative embodiment, the spatial filter 668 is the photodissociating window. In an embodiment, the transmittance of the window region 668b of the spatial filter 668 is above a reaction threshold. In an embodiment, the reaction threshold is a transmittance threshold at which transmittance of the photodissociating radiation through the spatial filter 668 initiates photodissociation reaction directly with an extrusion on the mesa sidewalls and breaks down the extrusion 644 into volatile compounds which are removed from a first gap 658 with air from one or more gas ports. In an embodiment, the reaction threshold is a transmittance threshold at which transmittance of the photodissociating radiation through the spatial filter 668 initiates a photolysis reaction that generates a reactive gas from a non-reactive precursor gas in the first gap 658. In an embodiment, the reaction threshold is a transmittance threshold at which transmittance of the photodissociating radiation through the spatial filter 668 initiates both the breakdown of extrusions and generation of a reactive gas from a non-reactive precursor gas. In an embodiment, the reaction threshold is 50%, the window region transmits greater than 50% of the photodissociating radiation.

The spatial filter 668 includes a central region 668a which absorbs the photodissociating radiation. In an alternative embodiment, central region 668a reflects the photodissociating radiation away from the patterning area of the mesa 110 of the template 108. In an embodiment, the transmittance of the central region 668a of the spatial filter 668 is below a damage threshold. The damage threshold is a transmittance threshold at which transmittance of the photodissociating radiation through the spatial filter 668 alters patterning surface coating 242 on the patterning surface 112 of the mesa 110. In an embodiment, the damage threshold is 10%, the central region transmits less than 10% of the photodissociating radiation. The dimensions of the central region 668a may substantially match the dimensions of the mesa 110 or the patterning area of the mesa 110. In the present context substantially match may mean within ±0.2 mm.

Figure 6C:
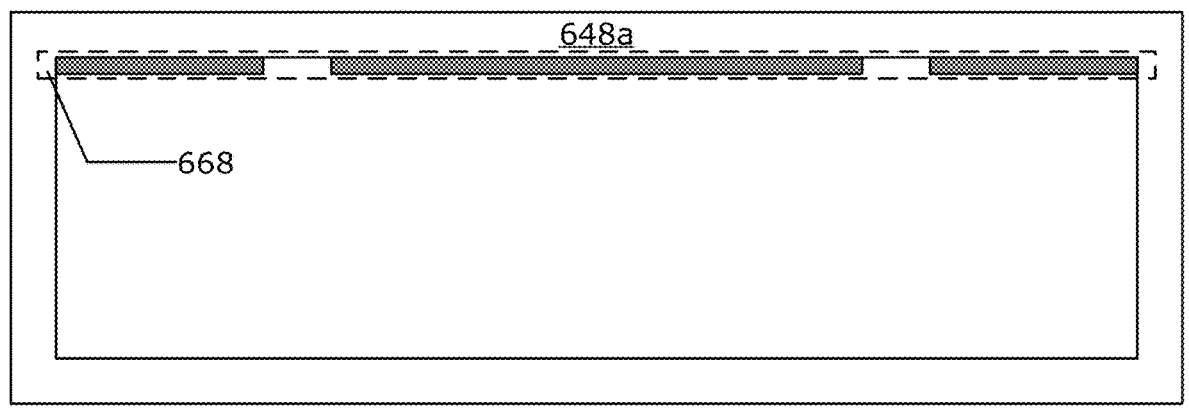
Figure 6D:
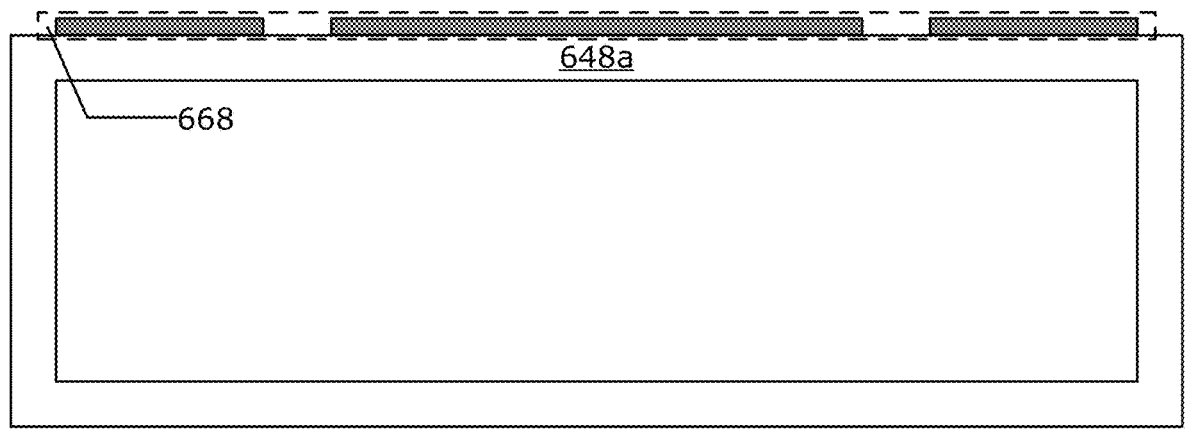

In an embodiment, the photodissociating frame window 648 may be a planar substrate that is planar for at least the length of the template 108 and may extend further, such as beyond the template chuck 118 and/or mag control hardware that is used to stretch and squeeze the template as illustrated in FIGS. 6C-D. The spatial filter 668 may be: a separate component; a coating on a bottom surface of a photodissociating frame window 648 as illustrated in FIG. 6C; or a top surface of the photodissociating frame window 648 as illustrated in FIGS. 6A and 6D.

In an embodiment, the photodissociating frame window 648 has protrusions and/or recesses which facilitates: direction of gas flow; containment of gas; rate of local gas flow; and evacuation of gas from the mesa sidewall 240 and the first gap 658.

The Positioning System

Figure 6E:
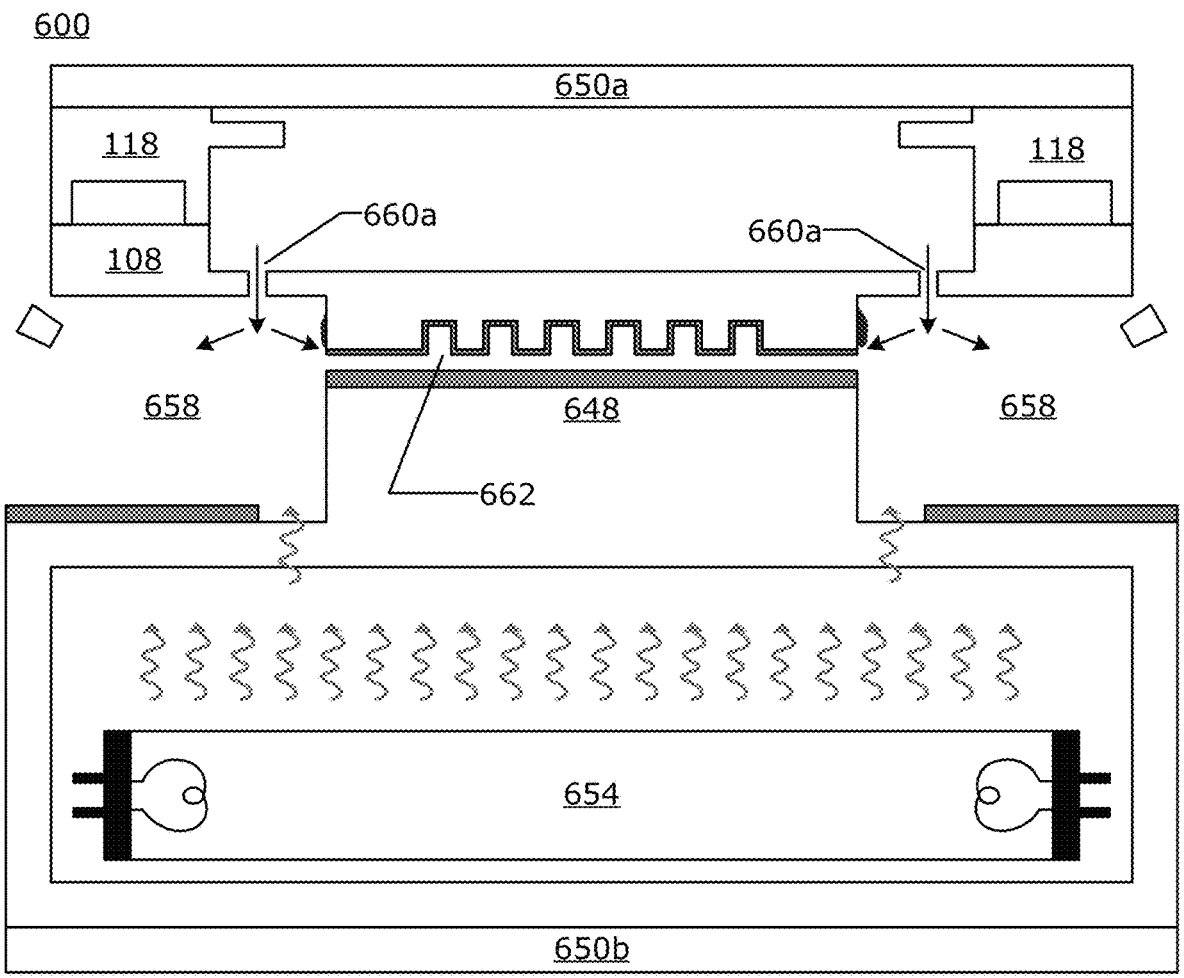
Figure 6G:
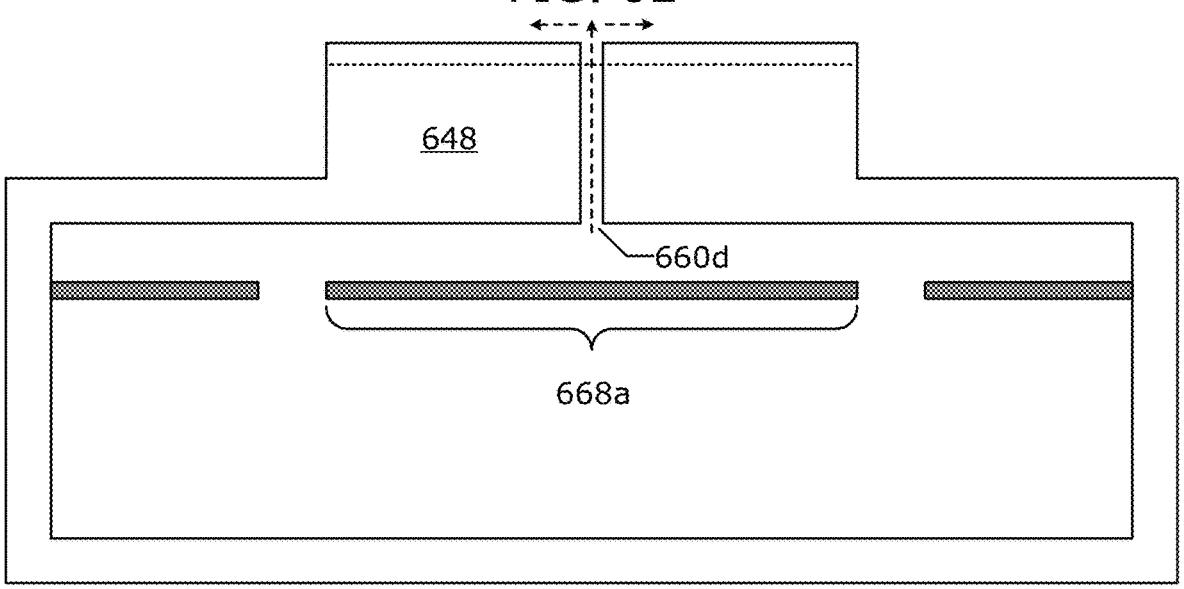
Figure 6F:
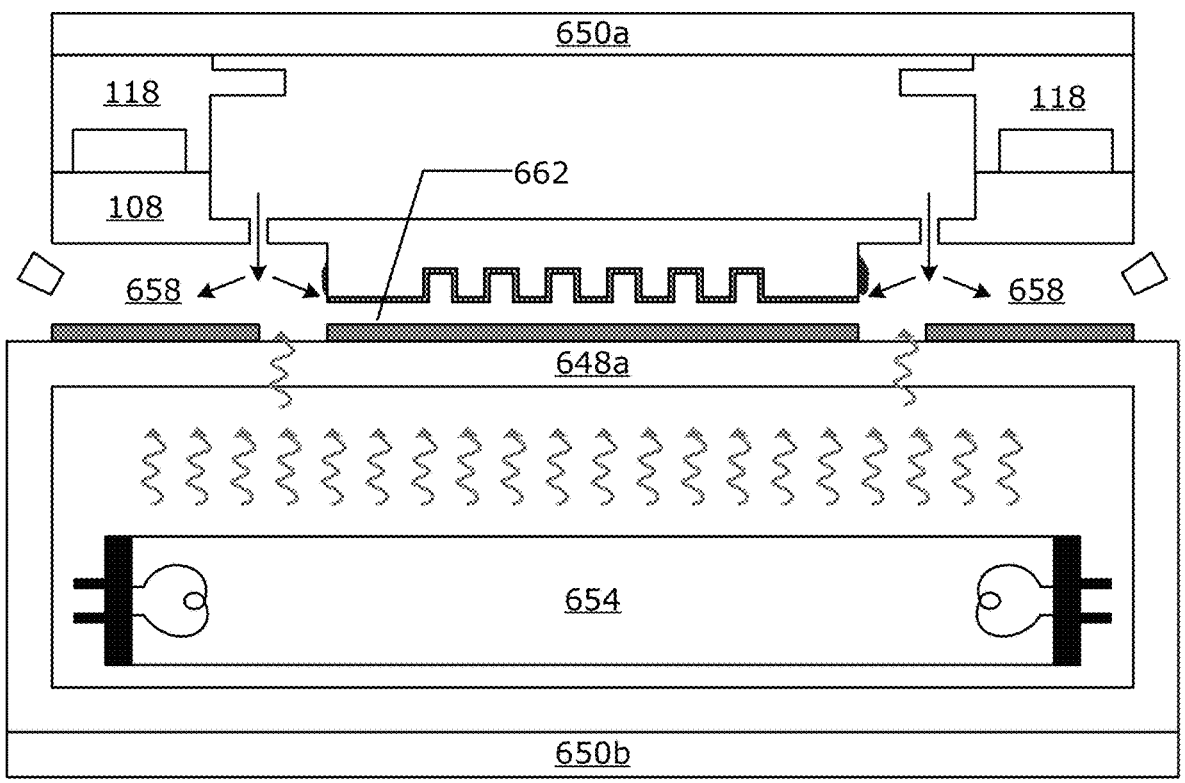

The positioning system 650 may include one or more positioning stages (650a, 650b) and/or motors which can position the template 108 relative to the photodissociating frame window 648 such that the first gap 658 is formed as illustrated in FIGS. 6E-F. In which the first gap 658 is bounded by at least: the recessed surface 238; the mesa sidewalls 240; and the photodissociating frame window 648. The photodissociating frame window 648 is configured to form the first gap while also protecting the patterning surface coating 242. The positioning system 650 may include a template chuck 118 and may include a photodissociating frame window chuck (not illustrated). The photodissociating frame window chuck is substantially similar to the substrate chuck 104. The positioning system 650 may share components with the nanoimprint system 100.

The positioning system 650 may include a template positioning stage 650a that is configured to position the template chuck 118. The template chuck 118 holds the template 108 that is modified by the mesa sidewall cleaning apparatus 600. In an embodiment, the template chuck 118 is shared with the nanoimprint lithography system 100. The positioning system 650 may also include a photodissociating frame window positioning stage 650b. In an embodiment, the window positioning stage 650b shares components with the nanoimprint lithography system 100 such as substrate positioning stage 106 and/or the base of the nanoimprint lithography system 100.

In an embodiment, a raised area of the photodissociating frame window 648 is positioned close to but not touching the patterning surface coating 242 forming a second gap 662 as illustrated in FIG. 6E. In an alternative embodiment, a planar photodissociating frame window 648 is positioned close to but not touching the patterning surface coating 242 forming the second gap 662 as illustrated in FIG. 6F. The second gap 662 is configured to be narrow enough to restrict the flow of gas from the first gap 658 into the second gap 662 and protect patterning surface coating 242 from any reactive gas that is temporarily formed in the first gap 658. The applicant has found that when the second gap 662 has a height that is 5 μm or less the patterning surface coating 242 can be protected from a reactive gas in the first gap 658 and photodissociation products. The applicant has found that gas flow can be substantially restricted to certain areas, such as the patterning surface 112 of the template 108, by decreasing the second gap 662 between the photodissociating frame window 648 and the mesa 110 which increases the resistance to flow of gas into the second gap 662. In an embodiment, the photodissociating frame window mesa has a height of 0.2 mm to 5 mm. In an alternative embodiment, the photodissociating frame window mesa may be nearly equal in height to the template mesa height.

For example the photodissociating frame window 648 may be made to have a photodissociating frame window mesa that stands 200 μm tall and has approximately the same lateral dimensions as the template mesa. An embodiment may be a mesa sidewall cleaning apparatus that is configured to bring the photodissociating frame window mesa into close proximity, for example 5 μm distance from the template mesa so as to form a restricted gas pathway (second gap 662). The mesa sidewall cleaning apparatus may be configured to clean mesa sidewalls with a specified height (i.e. 30 μm). The mesa photodissociating frame window may be configured to have a height of 200 μm. In which case, the first gap 658 may have a height of 235 μm between the photodissociating frame window recessed surface and the template recessed surface 238.

The positioning system 650 may be configured to achieve parallelism between the patterning surface coating 242 and the photodissociating frame window 648. In an embodiment, the photodissociating frame window positioning stage is at least capable of x-y and theta movement. In an embodiment, the photodissociating frame window positioning stage may include a z-axis movement stage. The template chuck 118 may be configured to adjust the back pressure to maintain template flatness during and/or prior to the mesa sidewall cleaning process. In an embodiment, the template flatness may be measured during and/or prior to the mesa sidewall cleaning process. In an embodiment, the positioning system 650 may include sensors, logic elements, controllers, motors, and/or actuators that are used detect and adjust the relative positions of the photodissociating frame window and the template. A laser sensor may be used to map the surface of the template 108.

The photodissociating frame window 648 and/or the photodissociating frame window chuck may include fiducial marks which are used by the positioning system 650 to align the central region 668a of the photodissociating frame window 648 with the mesa 110 of the template 108. The fiducial marks may be etched or deposited on top of the photodissociating frame window 648 and/or photodissociating frame window chuck. In an embodiment, the positioning system 650 has a positioning accuracy of 0.5 μm-0.1 μm.

The Photodissociating Radiation Source

The photodissociating radiation source 654 is configured to supply photodissociating radiation in the region of the mesa sidewalls 240 while the central region 668a of the photodissociating frame window 648 protects the patterning surface coating 242. The photodissociating radiation source 654 may include one or more of: LEDs, lasers, lamps; mercury lamps, halogen lamps, hollow cathode lamps, lenses, mirrors, apertures; waveguides; etc. which guides the light towards the mesa sidewalls 240. The light from the photodissociating radiation source 652 may pass through the window region 668b of the photodissociating frame window 648. The photodissociating radiation may have a wavelength of 172 nm, 193 nm, 222 nm, and/or 248 nm. In an embodiment, the lamp is Xenon excimer lamp.

In an embodiment, the photodissociating radiation source 654 is positioned below the template 108 and photodissociating radiation passes through the window region 668b of the photodissociating frame window 648 to break down extrusions directly or to generate a reactive gas near the mesa wall 240 by photodissociation of a precursor gas. Photolysis causes dissociation of molecular species (e.g. oxygen at photodissociating radiation wavelength of less than 242 nm, water vapor at photodissociating radiation wavelength of less than 190 nm) to form reactive species (ozone, atomic oxygen radical, hydroxyl radical). Photolysis can also cause the disassociation of an active species (e.g. ozone at photodissociating radiation wavelength of less than 310 nm) to create species with higher oxidative potential such as atomic oxygen radicals and hydroxyl radicals. In an alternative embodiment, high intensity IR, or high intensity visible light is used for multiphoton photolysis. In an embodiment, the wavelength of the photodissociating radiation has a sufficient energy level (7.2 eV, peak wavelength ($\lambda$) 172 nm) to cause the scission of bonds, such as C—C, C—H, C—O, C=C, C—N. In the context of the present disclosure, photodissociating radiation is radiation with a wavelength that has sufficient energy to break down extrusion directly or cause a precursor gas to become a reactive gas that breaks down the extrusion.

In an alternative embodiment, the reactive gas created by photodissociating the precursor gas is capable of decomposing the organic polymerizable material that forms the extrusions. In an alternative embodiment, the reactive gas is ozone which is formed from oxygen that is naturally found in the first gap 658. In an alternative embodiment, the photodissociating radiation generates radicals with a reactivity that is greater than ozone for enhanced decomposition of the extrusions 644 on the mesa sidewalls 240.

In an embodiment, the photodissociating radiation source includes an excimer laser such as KrF laser which produce photodissociating radiation at 248 nm or a KrCl laser which produces photodissociating radiation at 222 nm.

The photodissociating radiation source 654 may include one or more of a laser, LED, incandescent lamp, excimer lamp, hollow cathode lamp, etc. which provides radiation in a UV band and/or VUV band. The exposure time for the photodissociating radiation may be controlled by shutters and apertures. For example, a light blocking (absorbing, scattering, or reflective) spatial filter 668 can be applied to prevent transmission of light to the patterning surface coating 242.

The Gas Source

An alternative embodiment, may include a gas source 652. The gas source 652 may include one or more gas supply components such as: mass flow controller, regulators, valves; hoses, ports; couplers; gas cylinders; etc. which are configured to supply one or more gases to the first gap 658 and or the second gap 662. The gas supplied with the gas source 652 to the first gap 658 may include oxygen, ozone and/or water vapor, which the photodissociating radiation turns into oxygen radicals and hydroxyl radicals using photodissociating radiation less than 310 nm to disassociate ozone so as to generate oxygen radicals that react with the water molecules to generate the hydroxyl radicals and/or by disassociating oxygen or water molecules using photodissociating radiation less than 240 nm and 190 nm, respectively. In an embodiment, the gas stream supplied by the gas source 652 includes a carrier gas (e.g. hydrogen, oxygen, nitrogen, argon, helium, etc.), the carrier gas is a gas which does not become a reactive gas during the cleaning process.

In an embodiment, a carrier gas is nitrogen and a precursor gas is oxygen which comprises up to approximately 21% by volume of the total gas flow. The amount of gas flowing through the gas ports (which are also referred to as ports in this disclosure) may be on the order of 0.01-10 standard liters per minute (slpm) from one to four sides or corners of the template 108. In an embodiment, the gas source 652 may include a heater or cooler to control the temperature of the gas as it flows into the first gap 658.

Cleaning Reaction

In an embodiment, the photodissociating radiation passing through the window region 668b of the photodissociating frame window 648 reacts directly with the extrusion and breaks down the extrusion 644 into volatile compounds which are removed from the first gap 658 with air of one or more gas ports.

The hydroxyl radical reaction rate constants for organic compounds such as alkanes or alkenes which make up the extrusions can be several orders of magnitude higher when compared to ozone. The lifetime of the radicals is short. An embodiment may include exposing oxygen to radiation or an electrical discharge so as to create atomic oxygen radicals and ozone within a few centimeters of the mesa sidewalls 240. In an embodiment, a carrier gas helps to carry away the products of the cleaning process. In an embodiment, ozone may be converted back to oxygen by a catalytic or thermal destruct unit.

In an embodiment, the photodissociating radiation may be used to initiate a photolysis reaction that generates a reactive gas from a non-reactive precursor gas in the first gap 658. Wherein, the reactive gas is a species capable of abstracting hydrogen or causing scission of carbon-carbon bonds in the extruded material composition. Examples of precursor gases are: air; oxygen; nitrogen dioxide; carbon dioxide; water vapor; some nitrogen containing molecules; some oxygen containing molecules; etc. Other chemical reaction pathways may also be used to generate a reactive gas.

In an embodiment, ozone in the first gap 658 is exposed to photodissociating radiation from KrF laser (248 nm wavelength), which causes ozone to disassociate into an oxygen molecule and an oxygen radical. In which case, the ozone takes on the role of a precursor gas to the reactive gas. In an embodiment, the first gap 658 includes both ozone and water vapor, in which case, the oxygen radical may then generate two hydroxyl radicals from a reaction of the oxygen radical with a water molecule in the water vapor. The oxygen radical, hydroxyl radical, and ozone all take part in decomposition of the extrusion 644.

In an embodiment, oxygen gas is removed from one or both of the optical pathway between the window region 668b of the photodissociating frame window 648 and the photodissociating radiation source 654. Oxygen gas may be removed by flowing nitrogen gas into the optical pathway between the window region 668b of the photodissociating frame window 648 and the photodissociating radiation source 654. The photodissociating radiation source 654 may have a wavelength of 193 nm or alternatively has a wavelengths below 240 nm.

In an embodiment, reactive species are generated in the first gap 658. The reactive species is capable of cleaving organic bonds and decomposing organic materials. The reactive species are used to clean the mesa sidewalls 240. By generating the reactive species at the mesa sidewalls we can control what is and what is not impacted by the reactive gas. Highly reactive radicals, such as hydroxyl tend to have short lifetimes, the applicant has found that it is useful to create the radicals near the point of application, this has dual advantage of localizing the effect, and having a higher reaction rate.

Gas Flowing through the Template

In an embodiment, gas from the gas source 652 may be delivered through one or more gas ports 660*a* in the template 108*a* into the first gap 658 as illustrated in FIG. 6E. In an embodiment, the one or more gas ports 660*a* are positioned close to the mesa sidewall. The one or more gas ports 660*a* may also be used to pull or push volatile products of the cleaning process out of the first gap 658.

Gas Flowing though the Photodissociating Frame Window

In an alternative embodiment, gas from the gas source 652 is delivered through one or more gas ports 660*b* in the photodissociating frame window 648*a* into the first gap 658 as illustrated in FIG. 6A. The one or more gas ports in the photodissociating frame window 648*a* may also be used to pull or push volatile products of the cleaning process out of the first gap 658.

Gas Flowing via Side Gas Ports

In an alternative embodiment, gas from the gas source 652 is delivered through one or more gas ports 660*c* into the first gap 658 as illustrated in FIG. 6F. The one or more gas ports 660*c* may also be used to pull or push volatile products of the cleaning process out of the first gap 658.

Gas in the First Gap

An embodiment, may include a combination of one or more gas ports 660*a-d*, which provide one or more of: reactive gases; non-reactive gases; carrier gases; protective gases; and vacuum pressure.

In an embodiment, the introduction of reactive or non-reactive gases through the gas ports may occur after the second gap 662 is formed. The first gap 658 or a portion of the first gap may be exposed to photodissociating radiation to generate the reactive gas which is generated from gas that has flown through one or more of the gas ports 660*a-c*.

Gas and/or decomposition species may be captured by applying vacuum to one or more gas ports 660*a-c*. The vacuum may be applied while gas is being flowed into the first gap 658 and/or after the first gap 658 is no longer exposed to photodissociating radiation.

In an embodiment, reactive gas species are generated in the first gap 658 only while the patterning surface coating 242 is protected by for example, a narrow second gap 662, a protective gas between the patterning surface coating 242 and the central region 668*a* of the photodissociating frame window 648, or other techniques. In an embodiment, the gas flowing through the one or more of the gas ports may have a flow rate of 0.01-10 slpm on each side of template.

In an embodiment a first gas mixture is introduced into the first gap through the photodissociating frame window, template body, or nozzles located at the outer edge of the first gap 658. The first gas mixture may include a precursor gas with molecules that are converted to a reactive gas in the first gap 658. In an embodiment, the first gas mixture may also carry products of decomposition away from the mesa sidewalls to prevent adsorption and contamination of the freshly cleaned mesa sidewalls. As noted above vacuum or negative pressure may be used to recover gas and byproducts through holes or ports located in the photodissociating frame window, template, and/or nozzles at the edge of the first gap 658. In an embodiment, the photodissociating frame window 648 and or the first gas mixture may be heated to raise the temperate inside the first gap 658 to increase reaction rates of the reactive gas species to the extrusions 644. In an embodiment, a cooling gas may be blown against the template via one or more of the gas ports.

The reactive gas and/or decomposition species may be removed from the first gap 658 by applying vacuum to one or more of: gas ports 660*a* in the template 108; gas ports 660*b* in the photodissociating frame window 648*a*; and/or side gas ports 660*c*. In an embodiment, the reactive gas may break down formable material vapor in the first gap 658 and/or formable material on the mesa sidewalls 240; and/or oxidize formable material vapor in the first gap 658 and/or on the mesa sidewalls 240.

The template 108 and the photodissociating frame window 648 are arranged to create a first gap 658 that acts as a cleaning chamber. The cleaning chamber is bounded by recessed surface 238, mesa sidewalls 240, and the photodissociating frame window 648. In an embodiment, the sides of the cleaning chamber may be open. The role of the first gap 658 (cleaning chamber) is to facilitate delivery, containment, and evacuation of the reactive gas inside the first gap 658.

In an embodiment, the space between the template 108 and the photodissociating frame window 648 prior to the first gap 658 being formed may be backfilled with a carrier gas which will not become a reactive gas when exposed to photodissociating radiation. In an embodiment, the first gap 658 is filled with the carrier gas which will not become a reactive gas when exposed to photodissociating radiation, and the non-reactive gas is then flowed into the first gap 658 which become a reactive gas when exposed to the photodissociating radiation.

Photodissociating Frame Window with a Mesa

In an embodiment, the photodissociating frame window 648 may be comprised of two or more levels on the surface facing the first gap 658 as illustrated in FIG. 6E to form mesas, grooves, channels, and the like, which have been machined, molded, cast, etched, deposited, or laminated, to create a 3-D topography on the surface of the photodissociating frame window which controls the flow of gas during mesa sidewall cleaning. The photodissociating frame window 648 may include a raised area that is dimensionally matched to the mesa 110 of the template 108 as illustrated in FIG. 6E.

In an alternative embodiment, the photodissociating frame window mesa has a shape that matches the shape of the template mesa. For example, if the template mesa has a jigsaw shape, then photodissociating frame window mesa may also have a jigsaw shape. The photodissociating frame window mesa can be fabricated to have a dimensional difference of ±40 μm relative to the template mesa. This may be done for a couple of reasons. In an embodiment, the central region 668*a* of the photodissociating frame window may be undersized (5-150 μm) to expose the fluid control region of the mesa to cleaning. In an embodiment, the central region 668*a* of the photodissociating frame window may be oversized (5-5000 μm) to optimize the masking ability to prevent reactive species or photodissociation byproducts from entering the second gap.

Patterning Surface Protective Gap

In an embodiment, a central region 668*a* (which may be raised) of the photodissociating frame window 648*g* is positioned close to but not touching the patterning surface coating 242 forming a second gap 662 as illustrated in FIGS. 6E-F as described above. The second gap 662 is configured to be narrow enough to restrict the flow of gas from the first gap 658 into the second gap 662 and protect patterning surface coating 242 from any reactive gas that is temporarily formed in the first gap 658. The applicant has found that when the second gap 662 has a height that is 5 µm or less the patterning surface coating 242 can be protected from a reactive gas in the first gap 658. The applicant has found that gas flow can be substantially restricted to certain areas, such as the patterning surface 112 of the template 108, by decreasing the second gap 662 between the photodissociating frame window 648 and the mesa 110 which increases the resistance to flow of gas into the second gap 662. In an embodiment, the photodissociating frame window mesa may be nearly equal to the template mesa height.

For example, the photodissociating frame window 648 may be made to have a photodissociating frame window mesa that stands 200 µm tall and has approximately the same lateral dimensions as the template mesa. An embodiment may be a mesa sidewall cleaning apparatus 600 that is configured to bring the photodissociating frame window mesa into close proximity, for example 5 µm distance from the template mesa so as to form a restricted gas pathway (second gap 662). The mesa sidewall cleaning apparatus 600 may be configured to clean mesa sidewalls 240 with a specified height (i.e. 30 µm). The mesa photodissociating frame window may be configured to have a height of 200 µm. In which case, the first gap 658 may have a height of 235 µm between the photodissociating frame window recessed surface (which includes window region 668b and frame region 668c) and the template recessed surface 238.

Supplying Gas to the Protective Gap

Figure 6H:
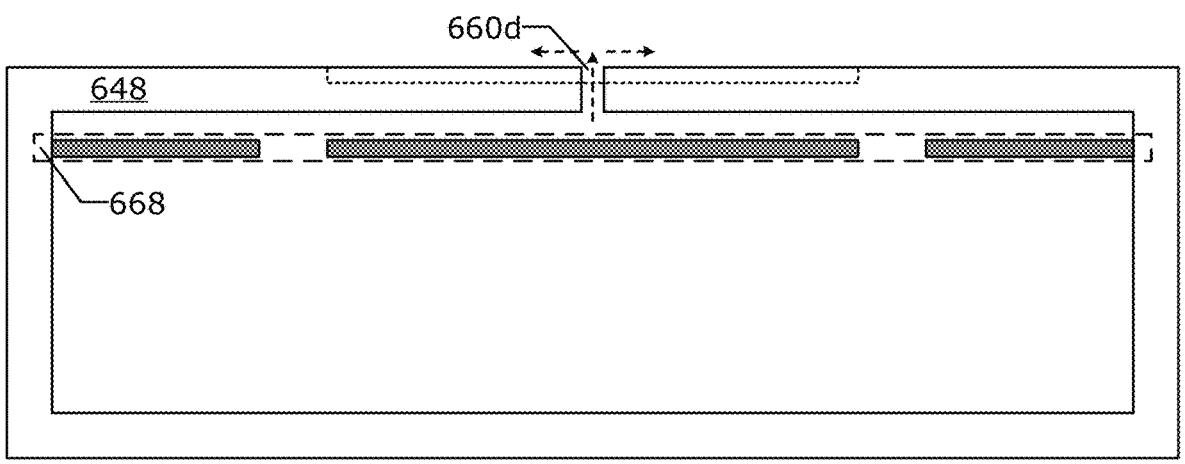

In an embodiment, the raised area of the photodissociating frame window 648 includes one or more gas ports 660d which are supplied with a protective gas from the gas source as illustrated in FIGS. 6G-H. The protective gas is a gas that does not substantially react with patterning surface coating 242. In an embodiment, the protective gas does not dissociate when exposed to light from the photodissociating radiation source 654. In an alternative embodiment, the protective gas while it is in the second gap is protected from light from the photodissociating radiation source 654 by the central region 668 of the spatial filter.

Figure 6I:
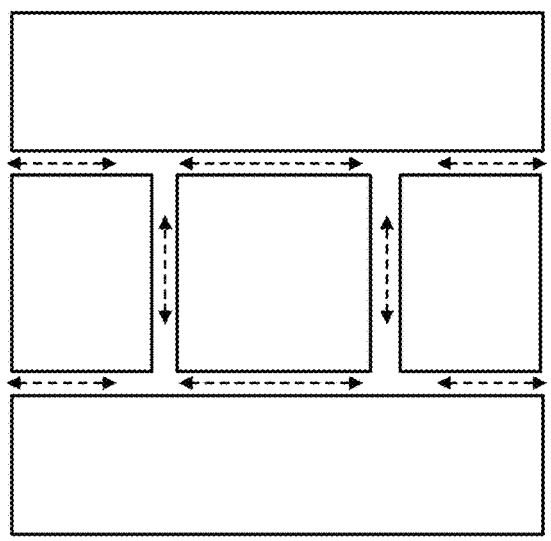

In an embodiment, the central region 668a of the photodissociating frame window 648 may include channels to facilitate flow along the mesa sidewall 240 where extrusions 644 form as illustrated in FIGS. 6G-I. The depth of the channels is illustrated by dashed lines in FIGS. 6G-H. The gas ports may be circular, rectangular, frame like etc. A typical photodissociating frame window may include multiple gas ports that are arranged in a symmetric manner around the mesa. In an alternative embodiment, the photodissociating frame window may include a single gas port that surrounds the mesa in a symmetric manner.

Gas Sensor

In an embodiment, the photodissociating frame window may contain a sensor to detect the concentration of a molecular gas species inside one or both of the first gap 658 and the second gap 662. The gas source may supply a plasma or a gas that becomes a plasma in the first gap but not in the second gap. In an embodiment, the photodissociating frame window 648 may act as a heat source or a heat sink that is heated or cooled to improve the rate at which extrusions are decomposed or removes heat produced by the photodissociating radiation.

Electrostatic Particle Protection

An embodiment, may include an electrostatic particle gathering system which can be used to remove particles from one or both of the photodissociating frame window 648 and the template 108 and to maintain cleanliness before, during and/or between mesa sidewall cleanings.

Structured Photodissociating Frame Window

Figure 6J:
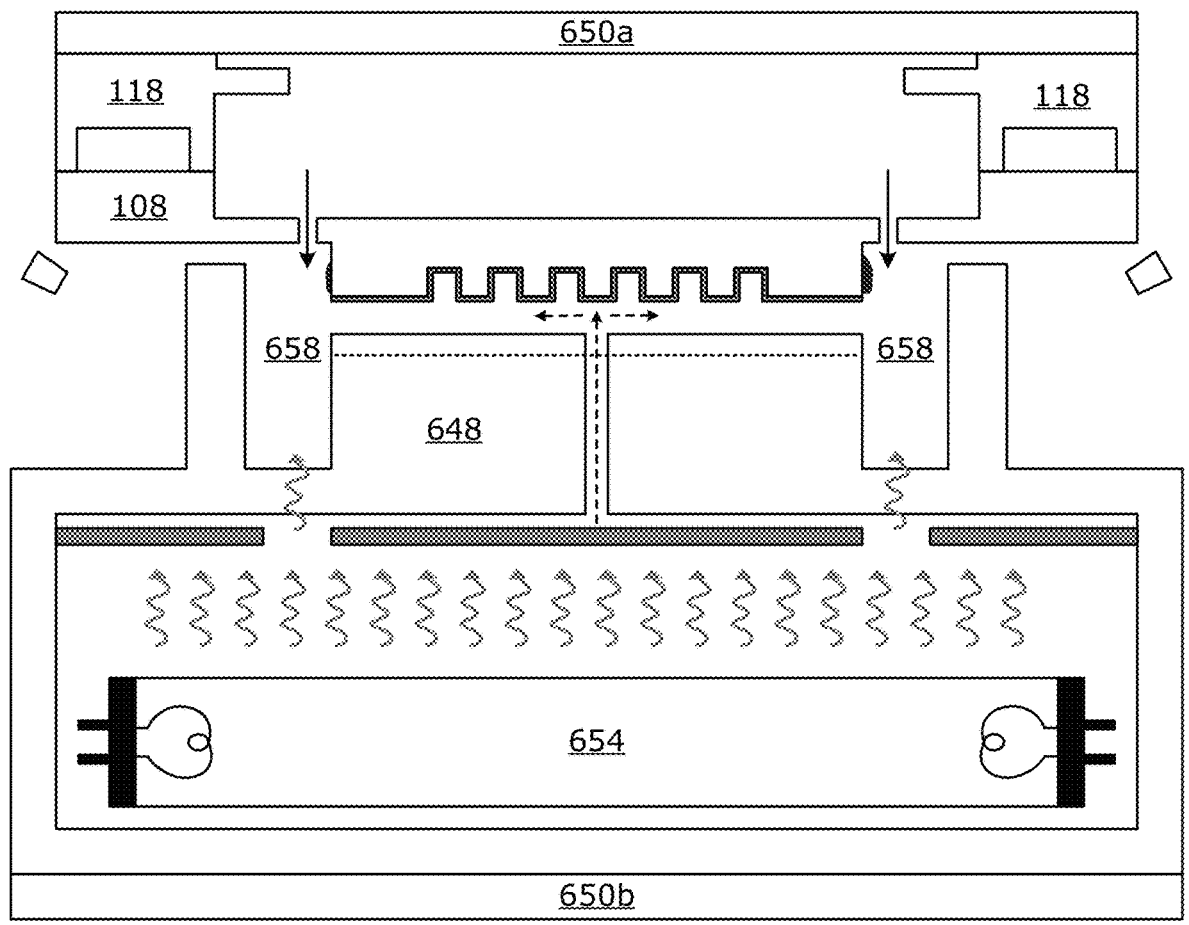

FIG. 6J is an illustration of a structured photodissociating frame window 648 that may be used in an embodiment that includes barriers that create restrictive flow paths at the edge of the structured photodissociating frame window 648 providing resistance to the flow of gas outside of the first gap 658 when the template is brought into close contact with the template 108. The positioning system may be configured to align the template and the structured photodissociating frame window 648 with each other so as to minimize the flow out of the first gap 658. Gas ports 660c outside of the photodissociating frame window 648k may be configured to blow gas in the region of a path between the photodissociating frame window and the template, thus providing an air current. In an alternative embodiment, the gas ports 660c may be configured to suck the gas out of the first gap 658 in a controlled manner. Gas may be supplied to or from the first gap 658 via gas ports 660a, 660b, and 660c. The embodiment, illustrated in FIG. 6J includes a second gap 662 with a protective gas supplied via gas port 660d.

The structured photodissociating frame window 648J may include channels, barriers, and/or cavities formed on the photodissociating frame windows recessed surface to provide conduits and areas where gas may flow in a controlled manner towards the mesa sidewalls and control the flow of photodissociating products away from the mesa sidewalls 240. The structured photodissociating frame window may include one or more gas ports such as gas ports which are positioned to control the flow gas in and out of the first gap 658. The gas ports may be in one or both of the photodissociating frame window 648 and the template 108. The embodiment, may include a second gap 662 with a protective gas supplied via gas port 660d.

In an embodiment, the photodissociating frame window may be designed to form a non-contact restrictive "gasket" to help retain reactive gases inside the first gap 658. In the same manner as the second gap 662 protects the pattern surface, the photodissociating frame window may also include a third gap towards the outer edge of the first gap which restricts the flow of gas out of the first gap. In accordance with Poiseuille's Law the resistance to flow between stationary parallel plates is inversely proportional to the cubic distance between them. In an embodiment, the ratio between the height of the third gap and the height of the first gap may be on the order 1:100. In which case, the ratio of the resistance to gas flow in the third gap relative to the first gap may be 1:1,000,000. In an embodiment, the depth of a channel is used to control flow of gas in out of certain regions.

In an embodiment, the photodissociating frame window is configured to form gaps and openings which passively guide the first gas mixture to the mesa sidewall and then carries the products of decomposition away from the mesa sidewalls. The one or more gas ports 660 may also be configured to push first gas mixture towards the mesa sidewalls. The one or more gas ports 660 may also be configured (via vacuum) to pull the products of decomposition away from the mesa sidewalls. Using vacuum to control the flow of the decomposition products allows the decomposition products to be removed, filtered, destroyed, etc. instead of being released inside the mesa sidewall cleaning apparatus. The photodissociating frame window may include topography that improves the containment of gas in the first gap 658. Containment of the gas reduces the escape of gas into other process modules. The added topography can provide restricted barriers to the flow of gas outside of the first gap 658. The added topography can also guide the gas to dedicated gas outlets such as vacuum gas ports. The photodissociating frame window may be fabricated with relative topography on the scale of 10-10,000 µm that passively controls the flow and/or containment of gas within the first gap 658.

A protective gas may be flown into the second gap 662 before, during and/or after vapor is produced in the first gap 658. The protective gas will protect the patterning surface 112 of the template.

Method of Cleaning Sidewall of Mesa

Figure 7A:
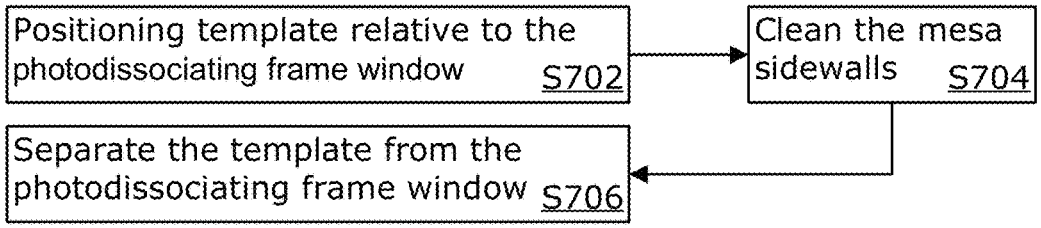
FIGS. 7A-E are illustrations of methods which are used to in embodiments.

FIG. 7A is an illustration of a method 700 of cleaning mesa sidewalls 240 of a mesa 110 with photodissociation radiation, while protecting the patterning surface 112 of the template 108 with a central region 668a of the photodissociation frame window. Cleaning the mesa sidewalls may include removing extrusions that have attached themselves to the mesa sidewalls during an imprinting process.

The method 700 may include a positioning step S702 of positioning a mesa 110 of the template 108 and the central region 668a of the photodissociating frame window 648 into a first position relative to each other at a start of a first period. When the template 108 and the photodissociating frame window 648 are in the first position a first gap 658 is formed. The first gap 658 is bounded by at least: frame region 668b of the photodissociating frame window 648, the window region 668b of the photodissociating frame window 648, the mesa sidewalls 240, and the recessed surface 238 of the template 108. The first gap 658 may have an outer edge which has an opening through which gas may escape from the first gap 658. The photodissociating frame window 648 may include barriers which restrict the flow of gas out of the first gap 658.

The method 700 may include a cleaning step S704 which is performed after the first gap is formed in the positioning step S702. The cleaning step S702 may include cleaning the mesa sidewalls with a reactive gas in the first gap during the first period or cleaning directly with photodissociating radiation which has passed through the window region 668b of the photodissociating frame window 648. During the first period, the central region 668a of the photodissociating frame window 648 is configured to protect the pattern area from the reactive gas and the photodissociating radiation while in the first position.

A precursor gas may enter the first gap 658 via one or more of: gas ports in the template; gas ports in the photodissociating frame window, gas ports of nozzles outside an outer edge of the first gap. In an embodiment, the precursor gas which enters the first gap does not clean the mesa sidewall until exposed to photodissociating radiation. In an embodiment, the gas which modifies the mesa sidewall only enters the first gap when the pattern area of the template is protected.

The method 700 may include a separation step S706 after the first period. During the separation step S706 the template 108 and the photodissociating frame window 648 are positioned in a second position relative to each other. In the second position the central region 668a of the photodissociating frame window 648 is not configured to protect the pattern area from any gases that are between the template and the photodissociating frame window.

During the cleaning step S704 a reactive gas in the first gap 658 may clean the mesa sidewalls 240 of the template 108 by removing material on the mesa sidewalls 240. At the same time as removing material from the mesa sidewalls 240 the reactive gas does not remove material from the pattern area because the pattern area of template is protected by a second gap.

Figure 7B:

The cleaning step S704, includes exposing the mesa sidewalls to a reactive gas. In one optional embodiment as illustrated in FIG. 7B, an optional cleaning step S704a includes optional step S708a of creating a reactive gas in the first gap during the first period. For example, a precursor gas is exposed to photolysis radiation so as to create the reactive gas. The reactive gas then modifies the mesa sidewalls 240 by cleaning the mesa sidewalls 240. In one optional embodiment, an optional cleaning step S704a also includes an optional purging step S710 of purging the reactive gas from the first gap after the first period, by one or both of: flowing a non-reactive purging gas into the first gap, or exhausting the reactive gas from the first gap. An embodiment may make use of an excimer VUV lamp producing light at a wavelength of 172 nm. The applicant has found that 172 nm light is effective at breaking the molecular bonds of the extrusion material. The applicant has also found that 172 nm light also destroys a surfactant layer on the patterned area of the template. The applicant has found that an effective mesa sidewall cleaning system is a combination of a 172 nm light source and the central region of the spatial filter to block the 172 nm light to break apart the extrusion material while also preventing the destruction of the surfactant layer on the patterned area of the template. In an embodiment, nitrogen behaves like a nonreactive gas in these circumstance in that it does not absorb 172 nm light and can be effectively used as a carrier gas, protective gas, and a purging gas between the lamp and the template.

Figure 7C:
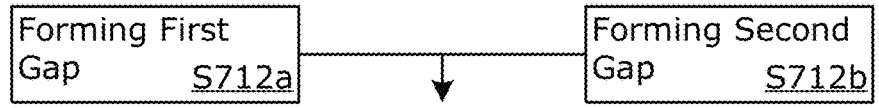

One optional embodiment may include an optional positioning step S702a as illustrated in FIG. 7C. The optional positioning step may include forming a first gap S712a and forming a second gap S712b at the same time. The first gap 658 is bounded by at least: frame region 668b of the photodissociating frame window 648, the window region 668b of the photodissociating frame window 648, the mesa sidewalls 240, and the recessed surface 238 of the template 108. The second gap 662 is bounded by the central region 668a of the photodissociating frame window 648 and the mesa 110. The second gap 662 provides resistance to the flow of gas from the first gap 658.

Figure 7D:
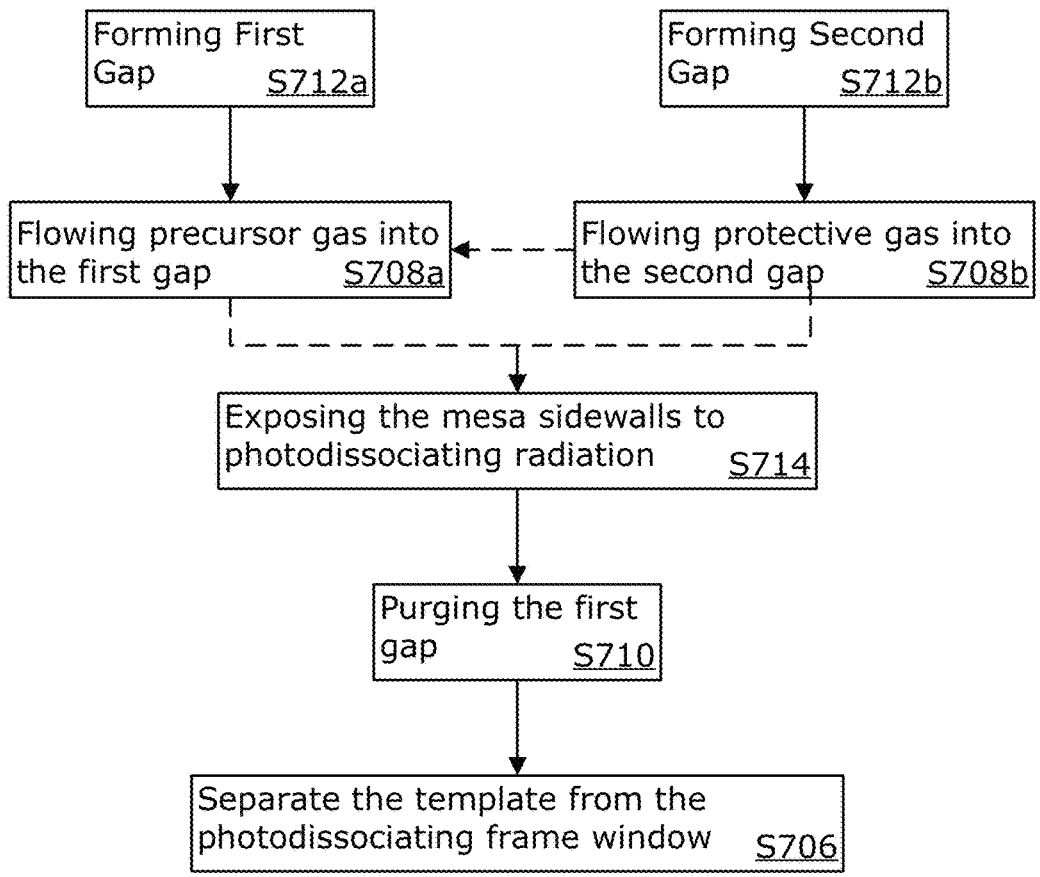

One optional method 700a as illustrated in FIG. 7D may include forming the first gap S712a and forming the second gap S712b between the pattern area and the central region 668a of the photodissociating frame window 648. A protective gas which may be non-reactive may be flown into the second gap in step S708b. The protective gas may begin flowing prior to the second gap being formed. In an optional step S708a, precursor gas may be flown into the first gap 658 after step S708b. The precursor gas may then be exposed to photodissociating radiation which has passed through the window region 668b of the photodissociating frame window 648, after step S708a. In an alternative embodiment, step S708a is not performed and the mesa sidewalls are exposed photodissociating radiation which has passed through the window region 668b of the photodissociating frame window 648, after step S708b. Gas and reaction products in the first gap may then be purged from the first gap in step S710. After the first gap is purged then the template and the photodissociating frame window may be moved to the second position in a separation step S706.

The precursor gas may be initially non-reactive or have relatively low reactivity that becomes reactive after being exposed to photodissociating radiation. The precursor gas may be a mixture that includes oxygen and water vapor. In one embodiment, the reactive gas is formed near the mesa sidewall by exposing precursor gas adjacent to the mesa sidewalls to photodissociating radiation in the substep S714.

In an embodiment, photodissociating radiation reaches the mesa sidewalls through one or more windows in the photodissociating frame window during the first period.

In an embodiment, there is movement of gas along the mesa sidewall throughout the cleaning process to supply fresh precursor gas to the mesa sidewall. Fresh precursor gas can replace precursor gas that is consumed, and remove the products of decomposition. In an embodiment, precursor gas is flowing while the region adjacent to the mesa sidewalls is exposed to photodissociating radiation. In an embodiment, the mixture of precursor gas and carrier gas flowing into the first gap is clean dry air (CDA). Gas flow at the mesa sidewalls may come from one or both of positive and negative pressure supplied one or all of the gas ports and nozzles.

Figure 7E:
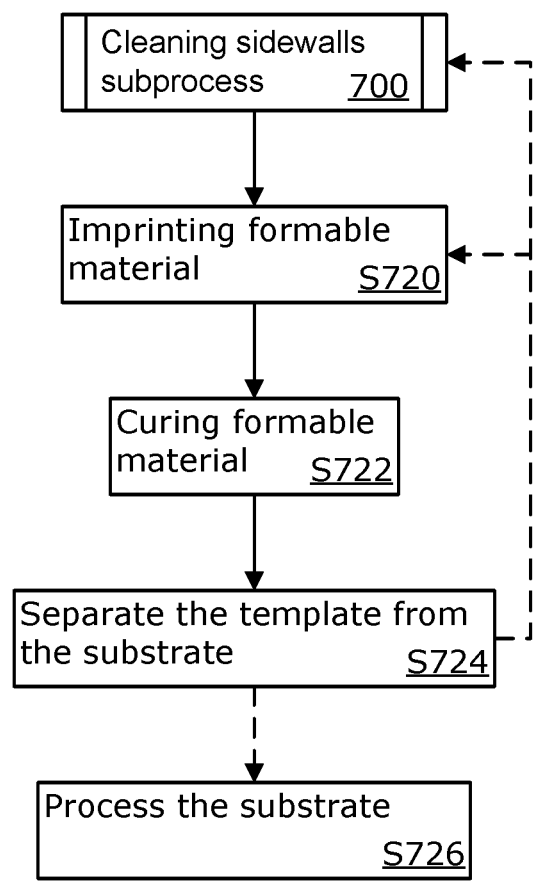

FIG. 7E is an illustration of a manufacturing method 766 which may use a nanoimprint lithography system 100. The manufacturing method 766 includes a subprocess 700 of cleaning the mesa sidewalls cleaning while protecting the patterning surface 112. Subprocess 700 may include one or more of the steps illustrated in FIGS. 7A-7D. The template 108 is used to imprint formable material 124 on the substrate 102 in an imprinting step S720. In an embodiment, step S720 may be performed after subprocess 700. In a step S722, the formable material 124 is cured while the template 108 is in contact with formable material 124 forming a patterned layer on the substrate 102. In a step S724, the template 108 is separated from the patterned layer on the substrate.

In an embodiment, the template 108 and the substrate 102 are moved relative to each other to a new imprinting field and the manufacturing method 766 returns to step S720. In an embodiment, the mesa sidewalls 240 are modified again in the subprocess 700, for example by cleaning extrusions produced during steps S720 and S722. In an embodiment, the mesa sidewalls are modified after a set number of imprints. In an embodiment, the mesa sidewalls are inspected and modified if the extrusions on the mesa sidewall are above a threshold. In an embodiment, steps S720, S722, and S724 are performed one or more times prior to subprocess 700 being performed for the first time. In an embodiment, photodissociating radiation passes through the backside of the template and produces photodissociating radiation reaction byproducts. An embodiment, may include purging (during or after the cleaning process) both the front and the back surface of the template (at the same time or separately) with a purging gas (i.e. nitrogen) which prevents the buildup of photodissociating radiation reaction byproducts (i.e. ozone) that are produced during the cleaning process. For example, am embodiment, may include purging the back surface of the template with nitrogen during and after the cleaning process, and purging the first gap with nitrogen after the cleaning process is over.

In an embodiment, the substrate undergoes further processing in a step S726. The further processing in step S726 may include etching processes to transfer a relief image into the substrate that corresponds to the pattern in the patterned layer. The further processing in step S726 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method for cleaning mesa sidewalls of a template, wherein the template has a pattern area on a first surface of a mesa, the mesa sidewalls surround the mesa, and a recessed surface surrounds the mesa sidewalls, the method comprising:
holding the template;
forming a first gap between a photodissociation frame window and the template; and
wherein the photodissociation frame window comprises:
a central region; and
a window region surrounding the central region;
wherein transmittance of photodissociation radiation by the central region is less than the damage threshold; and
wherein transmittance of the photodissociation radiation by the window region is greater than a reaction threshold;
wherein the first gap is bounded by: the mesa sidewalls; the recessed surface; and the window region of the photodissociation frame window;
sending the photodissociation radiation through the window region to expose a portion of the first gap adjacent to the mesa sidewalls to the photodissociation radiation;
wherein material on the mesa sidewalls is removed from the mesa sidewalls by exposing the portion of the first gap adjacent to the mesa sidewalls to the photodissociation radiation.

2. The method according to claim 1, the positioning system is further configured to position the template relative to the photodissociation frame window such that:
a second gap between the central region and the pattern area of the mesa is formed and further comprises sending a protective gas into the second gap.

3. The method according to claim 2, further comprising:
sending the photodissociation radiation through the window region to expose a precursor gas in the first gap only after the protective gas is supplied to the second gap.

4. The method according to claim 1, further comprising:
stop sending the photodissociation radiation through the window region;
after the photodissociation radiation is no longer sent through the window region, removing gas in the first gap using one or both of:
drawing gas from the first gap using vacuum; and
supplying a purging gas to the first gap;
moving the template farther away from the photodissociation frame window, after the gas in the first gap has started being removed from the first gap.

5. The method according to claim 1, wherein the photodissociation frame window further comprises a frame region surrounding the window region;
wherein transmittance of the photodissociation radiation by the frame region is less than the damage threshold;
wherein the first gap is also bounded by the frame region.

* * * * *